United States Patent [19]
Fulkerson

[11] Patent Number: 6,069,414
[45] Date of Patent: May 30, 2000

[54] APPARATUS AND METHOD FOR RECHARGING A STRING A AVALANCHE TRANSISTORS WITHIN A PULSE GENERATOR

[75] Inventor: E. Stephen Fulkerson, Livermore, Calif.

[73] Assignee: The Regents of the University of California, Oakland, Calif.

[21] Appl. No.: 09/100,186

[22] Filed: Jun. 19, 1998

[51] Int. Cl.[7] ....................................... H03K 3/26
[52] U.S. Cl. .......................... 307/106; 327/183; 327/422; 327/580; 359/257
[58] Field of Search ............................ 307/106; 327/422, 327/580, 183, 584; 359/257; 343/820

[56] References Cited

U.S. PATENT DOCUMENTS

| | | | |
|---|---|---|---|
| 3,555,301 | 1/1971 | Hansen | 327/422 |
| 3,665,222 | 5/1972 | Gatwood | 327/300 |
| 4,620,113 | 10/1986 | Sizer et al. | 359/257 |
| 5,003,191 | 3/1991 | Boyle et al. | 327/580 |
| 5,216,695 | 6/1993 | Ross et al. | 343/820 |
| 5,434,456 | 7/1995 | Booth | 307/108 |

OTHER PUBLICATIONS

Design of Reliable High Voltage Avalanche Transistor Pulsers, E. Stephen Fulkerson, Rex Booth.

*Primary Examiner*—Albert W. Paladini
*Attorney, Agent, or Firm*—Llyod E. Dakin, Jr.

[57] ABSTRACT

An apparatus and method for recharging a string of avalanche transistors within a pulse generator is disclosed. A plurality of amplification stages are connected in series. Each stage includes an avalanche transistor and a capacitor. A trigger signal, causes the apparatus to generate a very high voltage pulse of a very brief duration which discharges the capacitors. Charge resistors inject current into the string of avalanche transistors at various points, recharging the capacitors. The method of the present invention includes the steps of supplying current to charge resistors from a power supply; using the charge resistors to charge capacitors connected to a set of serially connected avalanche transistors; triggering the avalanche transistors; generating a high-voltage pulse from the charge stored in the capacitors; and recharging the capacitors through the charge resistors.

20 Claims, 5 Drawing Sheets

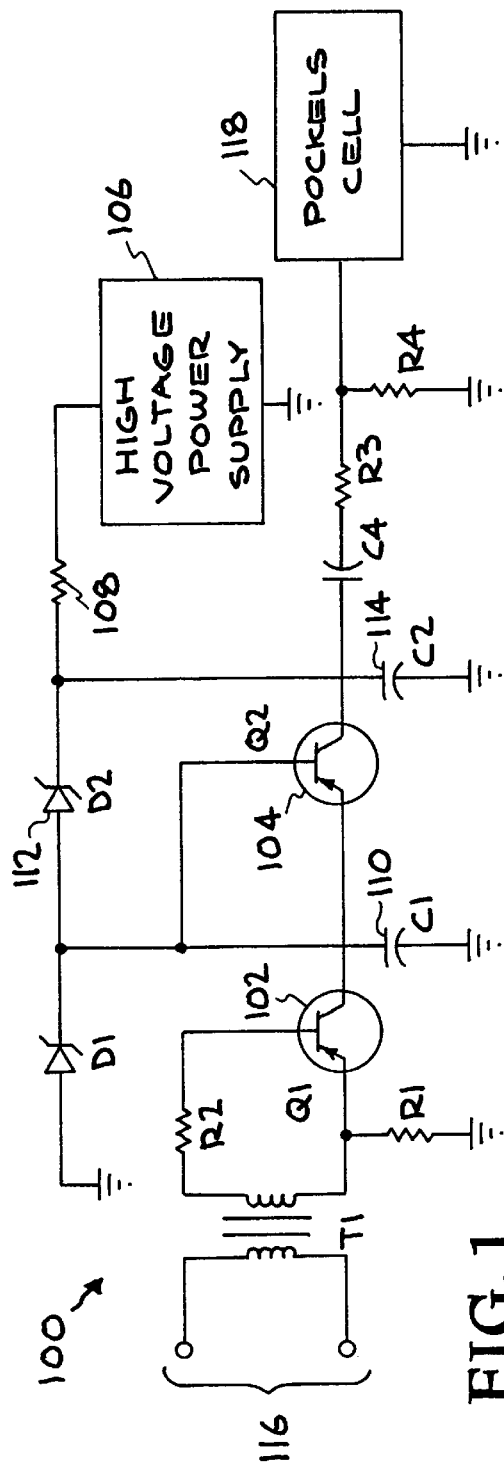
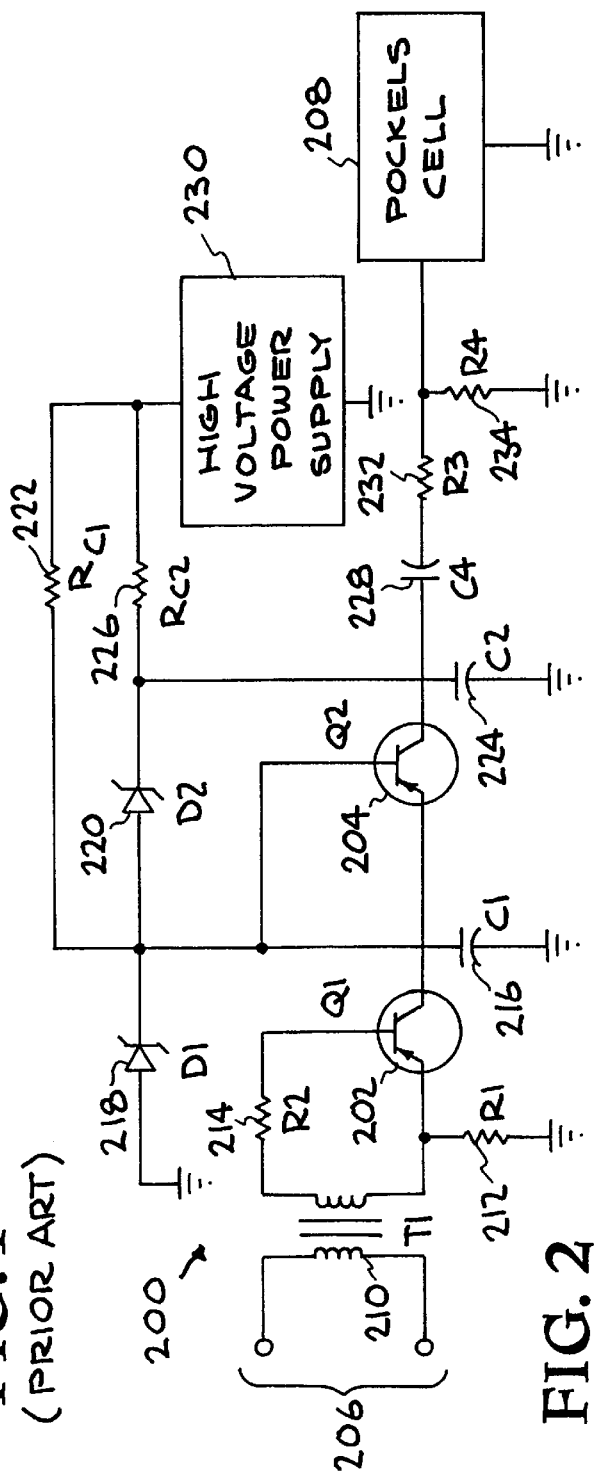
FIG. 1 (PRIOR ART)
FIG. 2

6,069,414

APPARATUS AND METHOD FOR RECHARGING A STRING A AVALANCHE TRANSISTORS WITHIN A PULSE GENERATOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to apparatus and methods for generating electrical pulses, and more particularly for recharging a string of avalanche transistors within a pulse generator designed to produce very high voltage, current, and power pulses of a very brief duration.

2. Discussion of Background Art

Pulse generators are versatile devices which are widely used throughout the electronics industry and are incorporated into many different electronic products. Each pulse generator however needs to be tailored to the needs of its intended application and thus the circuitry within any particular pulse generator may vary greatly.

In the field of optics, pulse generators are commonly used to drive Pockels cells. Pockels cells are widely known in the art as electro-optic light modulators which modify light wave polarization in response to voltages. In response to very high voltage short duration pulses, Pockels cells can act like switches. Such switches have significant application to laser based systems and can be used in laser machining tools. Laser machining tools use short duration laser pulses to machine surfaces. The shorter the laser pulse the less heat generated.

FIG. 1 is a circuit diagram of a prior art apparatus 100 for recharging avalanche transistors 102 and 104 useful for driving Pockels cells. The avalanche transistors are biased near an avalanche operating point by a high-voltage power supply 106 and a single charge resistor 108 connected to a first output capacitor 110 through a Zener diode 112 and directly to a second output capacitor 114. In response to an input trigger signal 116, the circuit 100 generates and transmits a high-voltage, short-duration output pulse to an output load 118, such as a Pockels cell. After generating a pulse, capacitors (C1) and (C2) are fully discharged. The capacitors 110 and 114 are then recharged by current flowing from the high-voltage power supply 106. The power supply 106 charges each of the capacitors 110 and 114 through the charge resistor 108 and the Zener diode 112. At first Zener diode 112 is off and only (C2) 114 is charging. When the voltage across (C2) 114 reaches the Zener voltage of diode 112, diode 112 turns on and both (C1) 110 and (C2) 114 are then charging. Once, both capacitors 110 and 114 are charged, the pulse generator circuit 100 is ready to generate a next pulse at the output 118.

A paper entitled Design of Reliable High Voltage Avalanche Transistor Pulsers, by E. S. Fulkerson, R. Booth and presented at the 21st International Power Modulator Symposium at Costa Mesa, Calif. in June of 1994 contains additional details on the operation of the prior art apparatus and is incorporated herein by reference. One manufacturer of pulse generators using strings of avalanche transistors, such as shown in FIG. 1, is "Kentec," a British Company, which produce 5 kV pulses with 100 picosecond widths.

The circuit in FIG. 1 operates at about a 5 kHz frequency and is useful for some applications. This slow maximum pulse rate is limited by the ability of the circuit 100 to recharge the output capacitors 110 and 114. Industry, however, is demanding more effective laser machining tools capable of operating faster than 5 kHz.

In response to the concerns discussed above, what is needed is an apparatus and method for recharging a string of avalanche transistors within a pulse generator that operates at higher frequencies.

SUMMARY OF THE INVENTION

The present invention is an apparatus for recharging a string of avalanche transistors within a pulse generator. The apparatus of the present invention consists of a plurality of amplification stages connected in series. Each stage is includes an avalanche transistor and a capacitor. In response to a trigger signal, the apparatus generates a very high voltage pulse of a very brief duration which discharges the capacitors. These capacitors must recharge prior to generation of a next pulse. The time required for the apparatus to recharge these capacitors sets a maximum repetition rate for the apparatus. Charge resistors directly couple a high voltage power supply to these capacitors. This has an effect of injecting current into the string of avalanche transistors at various points, enabling the capacitors to recharge more quickly. As a result, the maximum repetition rate for the apparatus also increases. Current may be injected into the string at every stage or at only selected stages. Also, because the current which recharges the capacitors need not flow through Zener diodes, the apparatus recharges more quickly. The pulse generator discussed is particularly useful for driving Pockels cells, which have wide application in the field of Lasers.

The method of the present invention includes the steps of supplying current to charge resistors from a power supply; using the charge resistors to charge capacitors connected to a set of serially connected avalanche transistors; triggering the avalanche transistors; generating a high-voltage pulse from the charge stored in the capacitors; and recharging the capacitors through the charge resistors.

These and other aspects of the invention will be recognized by those skilled in the art upon review of the detailed description, drawings, and claims set forth below.

BRIEF DESCRIPTION OF THE DRAWINGS

FIG. 1 is a circuit diagram of a prior art apparatus for recharging avalanche transistors;

FIG. 2 is a circuit diagram of a novel apparatus for recharging a string of two avalanche transistors;

DETAILED DESCRIPTION OF THE PREFERRED EMBODIMENT

Figure 3:
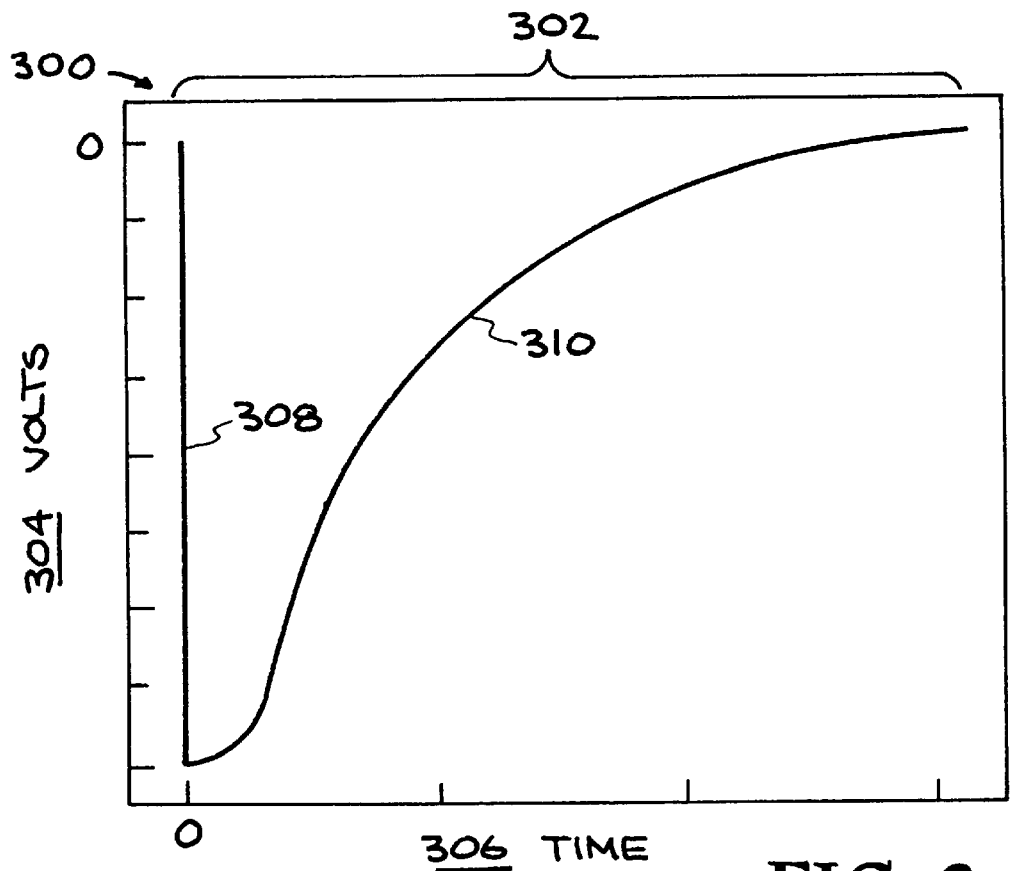
FIG. 3 is a timing diagram of an output pulse generated by the apparatus of FIG. 2.

FIG. 2 is a circuit diagram of a novel apparatus 200 for recharging a string of two avalanche transistors 202 and 204.

The specific voltages, resistances and such presented within this specification are merely an example of one embodiment of the novel circuit 200. Those skilled in the art will recognize that such voltages, resistances and such will change based on different embodiments of the circuit 200.

The circuit 200 is a pulse generator which, in response to a trigger signal received at an input 206, generates a very high-voltage, short-duration pulse at a high repetition rate for driving an output 208. In an embodiment of the invention described herein, a Pockels cell is connected to the output 208. The input 206 receives the trigger signal from external circuitry (not shown). The signal passes through a transformer (T1) 210 and a resistive network, R1 212 and R2 214, before reaching avalanche transistor 202. A first end of output capacitor (C1) 216 is coupled, as shown in FIG. 2, to an output of transistor 202, two inputs of transistor 204, one end of Zener diode (D1) 218, one end of Zener diode (D2) 220, and one end of charge resistor (Rc1) 222. A second end of capacitor 216 and diode 218 are coupled to ground. Avalanche transistor 204 begins a second stage of the pulse generator. A first end of output capacitor (C2) 224 is coupled to an output of transistor 204, another end of diode 220, one end of charge resistor (Rc2) 226, and one end of capacitor (C4) 228. A second end of capacitor 224 is coupled to ground. A high-voltage power supply 230 is connected to another end of both charge resistors Rc1 222 and Rc2 226. Resistor (R3) 232 connects another end of capacitor 228 to one end of resistor (R4) 234 and the output 208. Another end of resistor 234 is connected to ground.

The inductance of the transistors 102 and 104, about 2 nH, along with the capacitors 216 and 224 act as a lumped element LC transmission line. To minimize parasitic inductance, the capacitors 216 and 224 are preferably formed by leads directly etched on a surface of a printed circuit board containing the circuit 200. Impedance from stage (Q2) to stage (Q1) tapers smoothly from about 50Ω at the output of transistor 204 to about 3Ω at the input of transistor 202. Resistor (R1) 212 prevents any signals reflected back from the output 208 from damaging the transistors 202 and 204.

The transistors 202 and 204 are, in the current embodiment, Zetex Inc. FMMT-417 surface mount (SOT-23) NPN silicon planar avalanche units with a guaranteed minimum Collector-Base breakdown voltage (Vcbo) of 320V. The Zener diodes 218 and 220 at each stage limit DC voltages across the transistors 202 and 204 to a value slightly below the transistor's avalanche voltage. Keeping the transistors out of their breakdown region results in a more consistent operation from stage to stage and increases noise immunity of the circuit 200. The high voltage power supply 230 is preferably mounted with the circuit 200 in a single compact (2"×3"×6") EMI shielded enclosure. In some cases, however, operation at higher repetition rates may require that the power supply 230 be external and that a +12V fan be added to cool the circuit 200. For purposes of circuit design, the Pockels cell connected to the output 208 may be treated as a simple capacitive load (about 6 pF for a 10 mm Pockels cell). Only two stages (Q1 and Q2) are shown in FIG. 2, however, depending on the voltage required to drive the Pockels cell, twelve to sixteen stages may be necessary.

Operation of the circuit 200 is as follows. To begin, the first stage Q1 (lowest voltage) is triggered via the pulse transformer (T1) 210. This places a collector of transistor 202 near ground resulting in about a 600V collector to emitter voltage across transistor 204. In response, transistor 204 enters avalanche breakdown due to this over-voltage conditions. If additional avalanche transistor stages are added to the circuit 200, each succeeding stage experiences an even greater over-voltage conditions, resulting in a "crack-the-whip" effect that produces an even faster output pulse rise or fall time and an even greater voltage transition. The output 208 does not receive the high-voltage pulse until transistor 204 switches. Thus in the limit, the output pulse rise time is dependent upon how fast transistor 204 (i.e. a last transistor in the series of stages) turns on.

Depending on the crystal used, some Pockels cells darken or "fog" with long term DC voltage exposure. Thus, coupling capacitor (C4) 228 protects the Pockels cell from any DC voltages. Resistor (R3) 232 provides impedance matching for the string of transistors 202 and 204 during the rise or fall time of the high-voltage pulse, further damping out reflections that could damage the transistors 202 and 204. Resistor R4 has provides a DC charging path for the coupling capacitor (C4) and also discharges the capacitance of the Pockels cell.

During each high-voltage pulse, the voltage stored in capacitor (C4) 228 is applied to the Pockels cell for a duration of the output pulse. The value of (C4) 228 determines both a final voltage across the Pockels cell and an output voltage droop during each high-voltage pulse. Capacitor (C4) 228 and the Pockels cell form a capacitive voltage divider. For an embodiment where 95% of the charge stored in capacitor 228 is to be applied to the Pockels cell, capacitor 228 must have at least 20 times the capacitance of the Pockels cell. The coupling capacitor 228 is partially discharged via resistor 234 after each high-voltage pulse. This is measured as a voltage droop at the Pockels cell. A value for resistor 234 is chosen that allows capacitor 228 to recharge within an inter-pulse period without excessive droop. A width of the high-voltage pulse is fixed by a recovery time of the avalanche transistors 202 and 204, and is on the order of one to 2 ms. The inter-pulse period is typically much longer than the high-voltage pulse so that selecting a value for resistor 234 is primarily a function of droop. The value of resistor 234 must also be chosen so as not to interfere with coupling capacitor 228 charging.

As noted above, there is "crack-the-whip" effect as the high-voltage pulse proceeds through the stages. If at least a lower half of the string (transistor 202 in this embodiment) is fully biased, the system produces a uniform stream of high-voltage output pulses.

To assure proper operation at high pulse repetition rates there are three conditions that must be met. First, the output coupling capacitor 228 must be fully recharged before the next pulse. Second, the voltage across each transistor in at least the lower half of the string (the portion closest to the trigger and transistor 202 in the embodiment shown in FIG. 2) must be close to the avalanche voltage of the transistor. Third, the voltage drop across the Zener diodes 218 and 220 must not exceed the avalanche voltage of the transistors 202 and 204.

After the circuit 200 transmits a high-voltage pulse to the output 208, capacitors (C1) 216 and (C2) 224 are fully discharged. The power supply 230 then charges capacitor (C1) 216 through charge resistor (Rc1) 222 and capacitor (C2) 224 through charge resistor (Rc2) 226. Since capacitors 216 and 224 are charged in parallel the circuit 200 is ready to generate a next high-voltage pulse sooner than if charging of capacitor 216 did not begin until the breakdown voltage of Zener diode 220 was overcome. Capacitors 216 and 224 need not be charged in parallel for circuit 200 to operate properly. Instead, circuit 200 operates faster because current is injected from the power supply 230 at more than one point in the circuit 200. This multiple-point current injection layout is key to speeding up the repetition rate of the circuit 200.

Due to a faster charging time, the circuit 200 of FIG. 2 can operate at higher repetition rates than the circuit 100 of FIG. 1. Repetition rates of over 10 kHz have been achieved during tests of the circuit 200. A preferred size of a charge resistor in the circuit 200 may be determined by combining all capacitances between the charge resistor and a next charge resistor and then calculating an RC time constant which allows each stage (Q1 and Q2) to recharge within a preselected time. Well known electrical circuit analysis tools like SPICE are useful in this regard.

An consequence of introducing these additional charge resistors 222 and 226 is an increase in the current flowing in the Zener diodes 218 and 220. This higher current results in a higher voltage drop across each avalanche transistor 202 and 204. This voltage drop must not rise above Vcbo of the avalanche transistors, or else the transistors will re-trigger between pulses and fail sooner. Selecting Zener diodes 218 and 220 with a lower reverse breakdown voltage keeps the voltage drop below Vcbo.

High temperatures affect optical alignment of the Pockels cell so waste heat is removed from an enclosure (not shown) surrounding the circuit by a fan motivated by a small (40 mm square) 12 vDC brushless motor rated at 7 cfm. The motor is driven by a small integrated circuit oscillator integral with the fan. Electro-magnetic interference (EMI) generated by the high-voltage pulses generated by the circuit can interrupt normal operation of the fan causing it to run slower. Shielding the motor from the EMI solves this problem.

When the pulse generator circuit 200 is configured to drive a Pockels cell with 4.5 kV and 9 kV high-voltage output pulses, optical switching speeds in the range of 850 ps to 1.3 ns have been observe with a trigger delay jitter of <200 ps one sigma.

When the Pockels cell repetition rate is pushed into the 10 kHz range, acoustic resonance can occur. The high-voltage pulses that drive the Pockels cell not only alter a polarization of light passing through the cell (the Pockels effect), but also cause a crystal in the Pockels cell to change shape (the piezoelectric effect). This mechanical stress acts like a "clapper" on a bell and the Pockels cell tends to "ring" for some period after receiving a high-voltage pulse. At low repetition rates this acoustic effect is not a factor because there is plenty of time for the acoustic oscillations to damp out. However, as a 10 kHz repetition rate is approached, the Pockels cells may still be resonating when a next drive pulse arrives. In extreme cases there may be continuous undamped oscillations. Testing has revealed that duration of the acoustic resonance varies greatly from cell to cell and manufacturer to manufacturer, even with cells of the same model number and manufacturer. Thus, each Pockels cell must be tested for acoustic resonance before being operated at a 10 kHz frequency. In time, by working with Pockels cell manufacturers, modified cell mounting structures may be developed to address this problem and lead to an improved yield of usable cells.

FIG. 3 is a timing diagram 300 of an output pulse 302 generated by the apparatus 200 of FIG. 2. In the diagram 300 voltage 304 is mapped with time 306. The overall output pulse 302 has a width determined by a time required to recharge the circuit 200 and is for the current application preferably on the order of one to two microseconds. The output pulse 302 may be broken up into a first region 308 and a second region 310. The first region 308 consists of a very fast rise time on the order of 100 ps to a very high-voltage on the order of thousands of volts. The second region 310 consists of a longer trailing edge fall time which is a function of the charging resistors 222 and 226 and the capacitance of the string.

In actual experiments, because the Pockels cell present a capacitive load, the rise time of the first region 304 can not be measured directly due to bandwidth limits of high impedance oscilloscope probes. Instead, the rise time is inferred from optical measurements of the Pockels cell.

Figure 4:
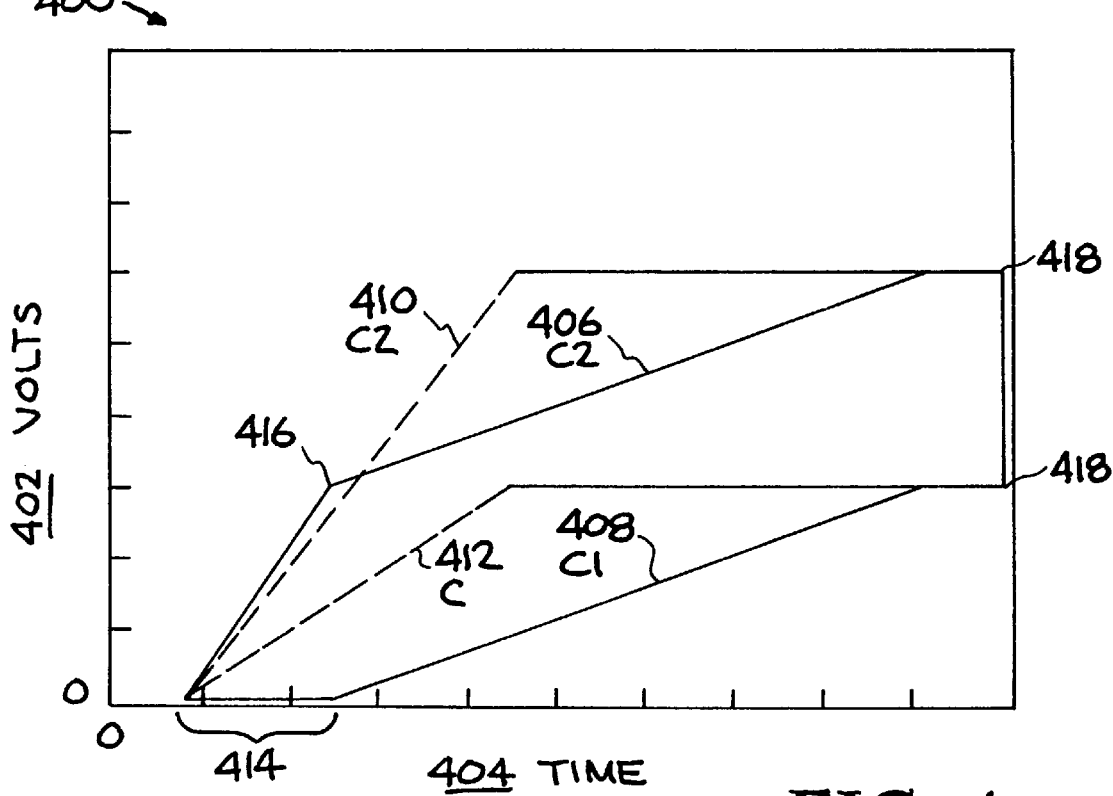
FIG. 4 is a timing diagram comparing a charge rate for capacitors charging in the apparatus of FIG. 2, with a charge rate for capacitors charging in the apparatus of FIG. 1.

FIG. 4 is a timing diagram 400 comparing a charge rate for capacitors 216 and 224 charging in the apparatus 200 of FIG. 2, with a charge rate for capacitors 110 and 114 charging in the apparatus 100 of FIG. 1. The timing diagram 400 was obtained by using a SPICE simulation. In the diagram voltage 402 is mapped with time 404. Four curves are shown. Curve 406 represents a charge rate for capacitor (C2) 114 in FIG. 1. Curve 408 represents a charge rate for capacitor (C1) 110 in FIG. 1. Curve 410 represents a charge rate for capacitor (C2) 224 in FIG. 2. Curve 412 represents a charge rate for capacitor (C1) 216 in FIG. 2. Note, in FIG. 1, because capacitor 110 does not begin to charge until the breakdown voltage for diode 112 is exceeded, curve 408 is delayed by time 414. For long strings of avalanche transistors, this delay can be a serious problem. However, in FIG. 2, current is injected into the circuit 200 at capacitor 216, capacitor 216 begins charging right away and thus curves 410 and 412 have a same starting point. Because of this current injection, circuit 200 has a higher maximum repetition rate than circuit 100. Curve 406 shows a deflection point 416 due to current drain by capacitor 110, as capacitor 110 begins to charge through charge resistor 108. A flat region 418 of curves 406 through 412 represents their fully charged voltage.

Figure 5:
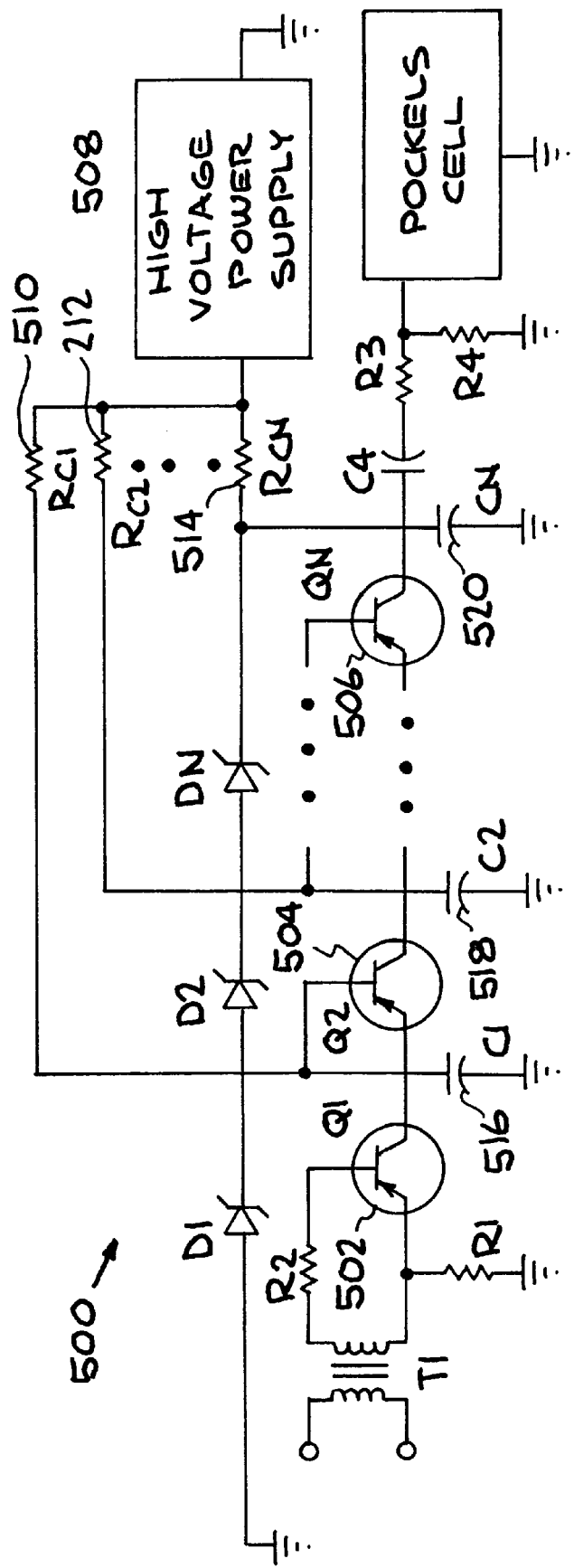
FIG. 5 is a circuit diagram of an apparatus for recharging a string of "n" avalanche transistors.

FIG. 5 is a circuit diagram of an apparatus 500 for recharging a string of "n" avalanche transistors 502 through 506. The circuit 500 is an alternate embodiment of circuit 200 in FIG. 2 which now includes "n" avalanche transistor stages (Q1 through Qn). So that the circuit 500 may have a very fast repetition rate, current is injected from the power supply 508, through "n" charge resistors 510 through 514, into the "n" capacitors 516 through 520. Otherwise, circuit 500 operation is the same as circuit 200.

Figure 6:
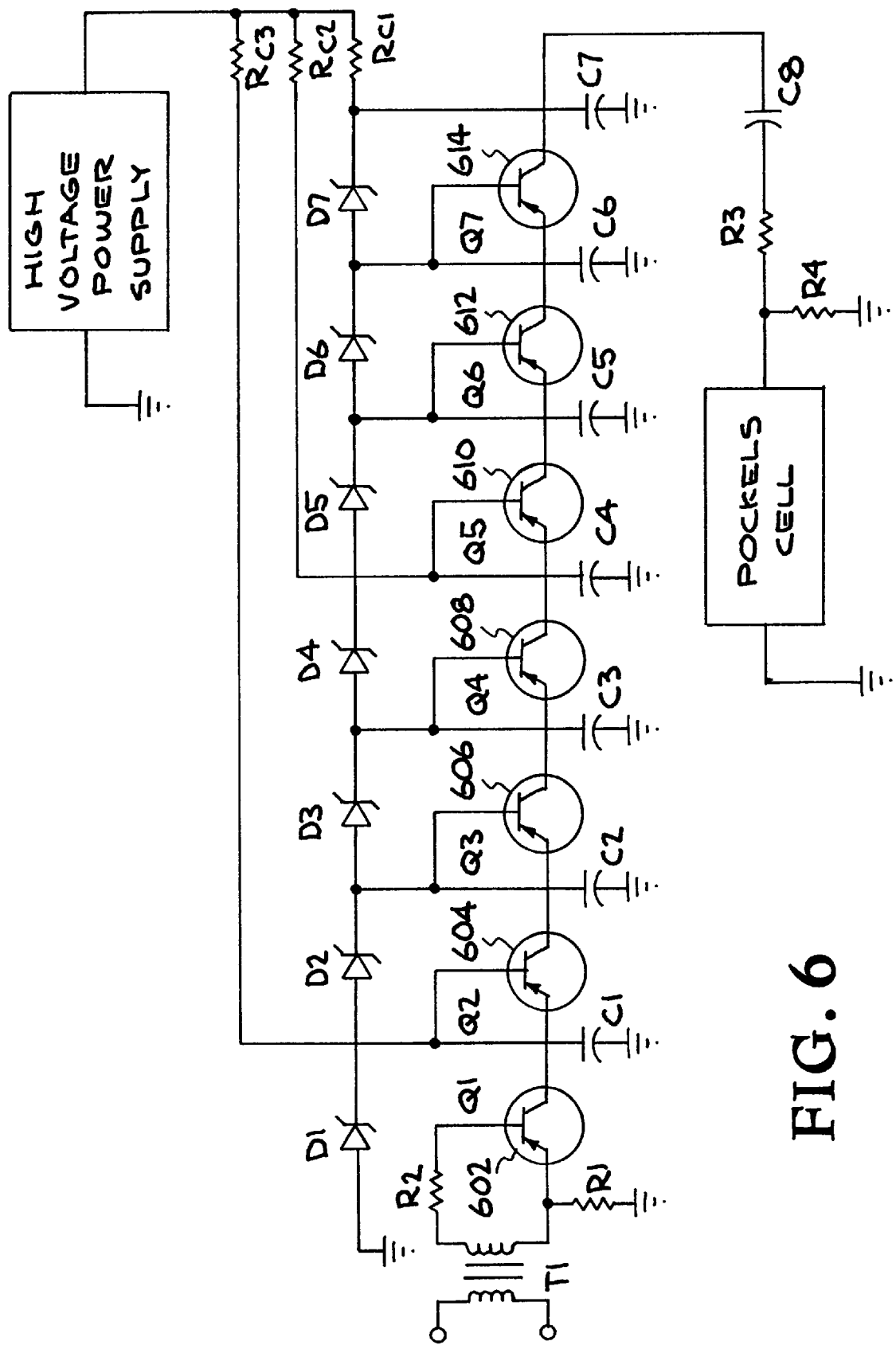
FIG. 6 is a circuit diagram of an apparatus for recharging a string of seven avalanche transistors.

FIG. 6 is a circuit diagram of an apparatus 600 for recharging a string of seven avalanche transistors 602 through 614. The circuit 600 is an alternate embodiment of circuit 200 in FIG. 2 which now includes seven avalanche transistor stages (Q1 through Q7). For applications where more moderate repetition rates are required, current need only be injected every few stages. In the circuit 600 shown, current is injected only between stages Q1 and Q2, Q4 and Q5, and after stage Q7. Those skilled in the art will recognize that current may or may not be injected at any particular stage in the string of avalanche transistors depending upon the repetition rate and recharge characteristics desired. Otherwise, circuit 600 operation is the same as circuit 200.

Figure 7:
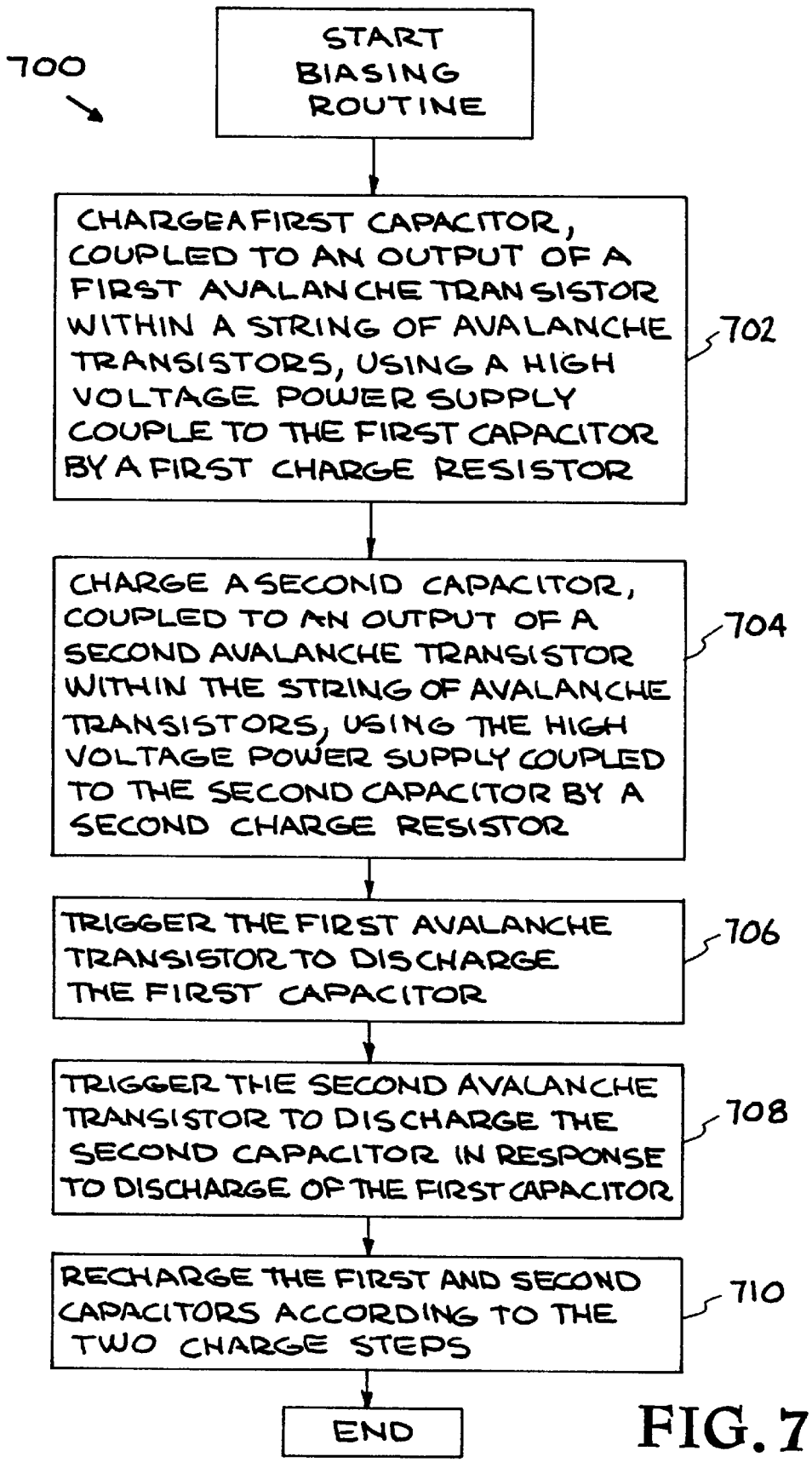
FIG. 7 is a flowchart of a method for recharging a string of avalanche transistors.

FIG. 7 is a flowchart 700 of a method for recharging a string of avalanche transistors. The method begins in step 702 where a first capacitor, coupled to an output of a first avalanche transistor within a string of avalanche transistors, is charged using a high voltage power supply coupled to the first capacitor by a first charge resistor. Next in step 704, a second capacitor, coupled to an output of a second avalanche transistor within the string of avalanche transistors, is charged using the high voltage power supply coupled to the second capacitor by a second charge resistor. The first avalanche transistor is triggered to discharge the first capacitor, in step 706. In step 708, the second avalanche transistor is triggered to discharge the second capacitor in response to discharge of the first capacitor. Next in step 710, the first and second capacitors are recharged according to the two charge steps. After step 710, the process of biasing strings of avalanche transistors is complete.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. An apparatus for recharging a string of a avalanche transistors within a pulse generator comprising:

a first stage comprising,
      a first avalanche transistor having an output; and
      a first capacitor coupled to the output of the first transistor;
   a second stage coupled to the first stage comprising,
      a second avalanche transistor having a base, an input and an output, the base and input of the second transistor coupled to the output of the first transistor; and
      a second capacitor coupled to the output of the second transistor;
   a first charge resistor coupled to the first capacitor; and
   a second charge resistor coupled to the second capacitor.

2. The apparatus of claim 1 further comprising a power supply coupled to the first charge resistor and the second charge resistor, whereby current is supplied to the first capacitor and the second capacitor.

3. The apparatus of claim 1 wherein the power supply is a high-voltage power supply.

4. The apparatus of claim 1 wherein:
   the first stage further comprises a first Zener diode coupled to the output of the first transistor; and
   the second stage further comprises a second Zener diode coupled between the output of the first transistor and the output of the second transistor.

5. The apparatus of claim 1:
   wherein the first transistor has an input; and
   the apparatus further comprising a triggering circuit coupled to the input of the first transistor.

6. The apparatus of claim 1 further comprising a Pockels cell coupled to the output of the second transistor.

7. An apparatus for recharging a string of avalanche transistors within a pulse generator comprising:

a first stage comprising,
      a first avalanche transistor having an output; and
      a first capacitor coupled to the output of the first transistor;
   a plurality of middle stages coupled in series with the first stage, each middle stage comprising,
      a middle avalanche transistor having an output; and
      a middle capacitor coupled to the output of the middle transistor;
   a last stage coupled in series with the middle stages comprising,
      a last avalanche transistor having an output; and
      a last capacitor coupled to the output of the last transistor;
   a predetermined subset of capacitors from a set comprising the first capacitor, the middle capacitors, and the last capacitor; and
   a plurality of charge resistors coupled to the predetermined subset of the capacitors.

8. The apparatus of claim 7 wherein the predetermined subset comprises two capacitors.

9. The apparatus of claim 7 wherein the predetermined subset comprises every capacitor.

10. The apparatus of claim 7 further comprising a power supply coupled to the plurality of charge resistors, whereby current is supplied to the predetermined subset.

11. The apparatus of claim 7 further comprising a Zener diode coupled between an output of a current stage and an output of a previous stage, wherein the current stage and the previous stage are a subset of the first, middle, and last stages.

12. The apparatus of claim 7:
   wherein the first transistor has an input; and
   the apparatus further comprises a triggering circuit coupled to the input of the first transistor.

13. A method for recharging a string of avalanche transistors within a pulse generator, comprising the steps of:
   supplying current to a first charge resistor from a power supply;
   charging a second capacitor, coupled to an output of a second avalanche transistor, from the current supplied to the second charge resistor;
   triggering the first avalanche transistor into discharging the first capacitor and thereby forming a first output pulse; and
   triggering the second avalanche transistor with the first output pulse into discharging the second capacitor and thereby forming a second output pulse.

14. The method of claim 13 further comprising the step of recharging the first and second capacitors.

15. The method of claim 13 further comprising the step of driving a Pockels cell in response to the discharging second capacitor.

16. The method of claim 13 further comprising the step of:
   supplying current to a third charge resistor in series with a Zener diode from a power supply;
   charging a third capacitor, coupled to an output of a third avalanche transistor, from the current supplied to the third charge resistor; and
   triggering the third avalanche transistor to discharge the third capacitor, in response to the discharging second capacitor.

17. An apparatus for recharging a string of avalanche transistors within a pulse generator, comprising:
   means for supplying current to a first charge resistor from a power supply;
   means for charging a first capacitor, coupled to an output of a first avalanche transistor, from the current supplied to the first charge resistor;
   means for supplying current to a second charge resistor from the power supply;

means for charging a second capacitor, coupled to an output of a second avalanche transistor, from the current supplied to the second charge resistor;

means for triggering the first avalanche transistor into discharging the first capacitor and thereby forming a first output pulse; and means for triggering the second avalanche transistor with the first output pulse into discharging the second capacitor and thereby forming a second output pulse.

18. The apparatus of claim 17 further comprising means for recharging the first and second capacitors.

19. The apparatus of claim 17 further comprising means for driving a Pockels cell in response to the discharging second capacitor.

20. The apparatus of claim 17 further comprising:

means for supplying current to a third charge resistor in series with a Zener diode from a power supply;

means for charging a third capacitor, coupled to an output of a third avalanche transistor, from the current supplied to the third charge resistor; and means for triggering the third avalanche transistor to discharge the third capacitor, in response to the discharging second capacitor.

* * * * *

UNITED STATES PATENT AND TRADEMARK OFFICE
CERTIFICATE OF CORRECTION

PATENT NO. : 6,069,414
DATED : May 30, 2000
INVENTOR(S) : E. Stephen Fulkerson

It is certified that error appears in the above-indentified patent and that said Letters Patent is hereby corrected as shown below:

On the title page, the title of the invention should read:

APPARATUS AND METHOD FOR RECHARGING A STRING OF AVALANCHE TRANSISTORS WITHIN A PULSE GENERATOR.

On the title page, under *Attorney, Agent, or Firm*, the name should read: Lloyd E. Dakin, Jr.

At column 1, lines 1-4, the title of the invention should read:

APPARATUS AND METHOD FOR RECHARGING A STRING OF AVALANCHE TRANSISTORS WITHIN A PULSE GENERATOR.

Signed and Sealed this

Third Day of April, 2001

*Attest:*

NICHOLAS P. GODICI

*Attesting Officer*    *Acting Director of the United States Patent and Trademark Office*